(12) United States Patent
Gossner (10) Patent No.: US 7,450,358 B2
(45) Date of Patent: Nov. 11, 2008

(54) ESD PROTECTIVE CIRCUIT FOR AN ELECTRONIC CIRCUIT HAVING TWO OR MORE SUPPLY VOLTAGES

(75) Inventor: Harald Gossner, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/046,295

(22) Filed: Jan. 27, 2005

(65) Prior Publication Data

US 2005/0168894 A1    Aug. 4, 2005

(30) Foreign Application Priority Data

Jan. 30, 2004  (DE) .................. 10 2004 004 789

(51) Int. Cl.
*H02H 9/00*    (2006.01)
*H02H 1/00*    (2006.01)

(52) U.S. Cl. ....................................... 361/56
(58) Field of Classification Search ............... 361/56
See application file for complete search history.

(56) References Cited

U.S. PATENT DOCUMENTS 5,121,108 A * 6/1992 Schemmel ................. 340/660

| 6,385,021 | B1 | 5/2002 | Takeda et al. ................ 361/56 |
| 6,507,471 | B2 * | 1/2003 | Colclaser et al. ........... 361/111 |
| 6,724,603 | B2 * | 4/2004 | Miller et al. ................ 361/111 |
| 6,757,147 | B1 * | 6/2004 | Tong et al. .................. 361/111 |
| 6,801,416 | B2 * | 10/2004 | Hatzilambrou et al. ........ 361/56 |
| 6,936,896 | B2 * | 8/2005 | Ida et al. ..................... 257/361 |
| 6,977,425 | B2 * | 12/2005 | Yoshida et al. ............. 257/517 |
| 2002/0084490 | A1 * | 7/2002 | Ker et al. ..................... 257/355 |
| 2003/0223166 | A1 | 12/2003 | Chen et al. .................... 361/56 |

* cited by examiner

*Primary Examiner*—Ronald W Leja
(74) *Attorney, Agent, or Firm*—Brinks Hofer Gilson & Lione (57) ABSTRACT

The ESD protective circuit according to the invention is designed for an electronic circuit which uses at least one first and one second supply voltage. This ESD protective circuit has a first and a second ESD protective element which can be activated via a control input and are electrically connected to the first and second supply voltage nodes, respectively, and has a control bus which electrically connects the control inputs of the ESD protective elements and, furthermore, has an overvoltage detector, which drives the control bus as a function of the potential at the first supply voltage node.

19 Claims, 4 Drawing Sheets

ESD PROTECTIVE CIRCUIT FOR AN ELECTRONIC CIRCUIT HAVING TWO OR MORE SUPPLY VOLTAGES

PRIORITY

This application claims the benefit of priority to German Patent Application DE 102004004789.8, filed Jan. 30, 2004, herein incorporated by reference in its entirety.

FIELD

This application relates to an ESD (Electrostatic Discharge) protective circuit and method thereof for an electrical circuit. More specifically, the application relates to an ESD protective circuit and method thereof for an electrical circuit that uses two or more supply voltages.

BACKGROUND

It is known that integrated circuits, in particular integrated circuits based on CMOS (Complementary Metal Oxide Semiconductor) circuit technology, must be protected against damaging electrostatic discharges. In this case, the aim is to ensure that, in the case of a network with a circuit which can be electrostatically charged via a pad from the exterior, electrostatic charge can be dissipated via a low impedance to the exterior again, without any damage to the integrated circuit, via a further network which is connected to the external environment. This is achieved using ESD protective elements having appropriately broad and thus low-impedance supply buses, which are each arranged between two networks, for example between the supply voltage node and the internal ground node. ESD protective elements such as these fundamentally have a high impedance and form a low-impedance dissipation path only in the event of an ESD, that is to say in the event of a supply from an electrostatic charge, so that no destructive discharge takes place via parallel-connected circuit parts. Semiconductor components, in particular diodes, are typically used as ESD protective elements, which become conductive either in the reverse direction or in the forward direction beyond a specific voltage.

Integrated circuits which are operated with two or more supply voltages and thus have two or more separate supply voltage networks, also referred to as domains, are particularly critical in terms of their protection against a damaging electrostatic discharge. When ESD loads occur between two supply voltage networks, parasitic npn substrate transistors between two n-doped trenches in the CMOS circuit core, which are at different potentials, can easily be caused to breakdown, and thus to be damaged, without appropriate protection. If the same voltage levels are used for different supply voltages, a low-impedance path between two different supply voltage networks can be provided either by means of two diodes, which are connected back-to-back in parallel between these networks, or by means of a direct connection between the two networks on an external substrate. However, the first option is not feasible when the various supply voltage levels differ by more than 0.6 V while, in contrast, the second option is generally not possible for supply voltages with different values, since a low-impedance path would otherwise already exist during normal operation of the circuit through the electrical connection via the substrate (for example by bonding to a common pad) between two supply voltage networks.

When different voltage levels are present, an ESD protective element is therefore arranged between two supply voltage networks. The ESD protective element has a high impedance, that is to say it is switched off, during normal operation of the circuit, and is activated only in the event of ESD so that its impedance becomes low. However, owing to the presence of broad supply buses, this is generally possible only between supply voltage networks in the pad frame area which are adjacent in the layout or in the area of the input or output cells, for example between the logic supply voltage network (for example 1.8 V) and the driver supply voltage network (for example 3.3 V). The use of a procedure for protection of supply voltage networks whose pads are physically a long distance apart from one another is difficult because long metal buses are used to the respective ESD protective element, thus reducing the useable chip area. If the width of the metal buses and thus the required chip area is reduced as a countermeasure to this, the resistance of the metal bus is increased. When an electrostatic discharge occurs via such a metal bus, this results in an increased voltage drop associated with the increased resistance, so that the ESD protective elements are activated only when the voltages between the supply voltage networks become higher. This can admittedly be counteracted by taking additional safety measures in the CMOS circuit core, in particular by increasing the distances between n-doped trenches at different potentials. However, this results in an increased space requirement in the CMOS circuit core. In addition, even when using automated circuit verification, the complexity of the circuits means that there is a risk of critical points in the layout being overlooked, or of further disturbing effects occurring. Furthermore, ESD-dependent measures relating to adjacent CMOS circuit cores which are connected to different supply voltages are difficult to handle during the design process (design flow), since the detailed relationships with respect to the position and the vicinity do not have to be defined until the circuit elements have been placed and connected in the layout (place and route) and, furthermore, additional logic cells must be provided.

The U.S. Pat. No. 6,385,021 B1 discloses an ESD protective circuit for a circuit having only one supply voltage, in which a number of ESD protective elements are distributed over the chip area, between the supply voltage node and ground. These ESD protective elements each have a control input, with the control inputs being connected to a common trigger bus. Furthermore, the ESD protective circuit has a trigger circuit, which monitors the supply voltage potential and activates the ESD protective elements by driving the trigger bus when an electrostatic discharge occurs.

Furthermore, the document U.S. 2003/0223166 A1 discloses an ESD protective circuit for a circuit having only one supply voltage, which has a number of ESD protective elements which are each arranged between a number of signal pads and either the supply voltage network or the ground node, or between the supply voltage network and the ground node. When an electrostatic discharge occurs, an ESD detector circuit activates a number of ESD protective elements, thus producing a number of dissipation paths.

BRIEF SUMMARY

The present application describes an ESD protective circuit and corresponding method for an electronic circuit having two or more supply voltages which, despite using only a small area, results in efficient, in particular early, dissipation of charge from a supply voltage node when an electrostatic discharge occurs.

By way of introduction only, an ESD protective circuit for an electronic circuit which uses first and second supply voltage has a first ESD protective element which is electrically connected via an input to a first supply voltage node which is associated with the first supply voltage. The ESD protective element also has a control input, via which it is activated in the event of ESD loads. In the activated state, the ESD protective element dissipates charge received from the input via an output. The ESD protective circuit also has a second ESD protective element, which is electrically connected via an input to a second supply voltage node which is associated with the second supply voltage. This ESD protective element has a control input via which it is activated in the event of ESD loads. In the activated state, the second ESD protective element dissipates charge received from the input via an output. The ESD protective circuit also has a control bus, which electrically connects the control inputs of the ESD protective elements. Furthermore, the ESD protective circuit contains a first overvoltage detector, which itself contains at least one measurement input for measurement of the potential at the first supply voltage node, and a control output for driving the control bus as a function of the measured potential.

In such an ESD protective circuit, when an electrostatic discharge takes place, the charge dissipation from the supply voltage node which has been monitored via the supply voltage detector is improved by simultaneous activation of two or more ESD protective elements. Since at least the second ESD protective element is also activated in addition to the first ESD protective element for the first supply voltage node when an electrostatic discharge occurs, while the second ESD protective element is initially associated only with the second supply voltage node by virtue of its direct electrical connection to the second supply voltage node, the second ESD protective element can also be used as part of a charge dissipation path once it has been activated. Since the second ESD protective element is activated via the control bus as a function of the potential at the first supply voltage node, the actual voltage difference between the input and the output of the second ESD protective element is irrelevant to activation of the second ESD protective element. Exceeding or undershooting activation voltages between the input and output of the second ESD protective element in order to allow the second ESD protective element to be used to dissipate charge from the first supply voltage node can be avoided. A low-impedance protective charge dissipation path is thus formed at an early stage, that is to say when the voltage loads are low.

For the purposes of this application, the expressions input and output of an ESD protective element are interchangeable, since the charge to be transported via the ESD protective element and the corresponding discharge current may have any mathematical signs. Furthermore ESD protective elements are generally designed to have symmetrical inputs and outputs.

The ESD protective circuit furthermore may have a second overvoltage detector, which contains at least one measurement input for measurement of the potential at the second supply voltage node and, in addition, a control output for driving the control bus as a function of the measured potential.

In this case, in the event of an electrostatic discharge, at least the first ESD protective element is also activated in addition to the second ESD protective element for the second supply voltage node, while first ESD protective element is initially associated only with the first supply voltage node, by virtue of its direct electrical connection to the first supply voltage node. Once the first ESD protective element has been activated, it can be used as part of a charge dissipation path for the second supply voltage node. The use of two overvoltage detectors, that is to say the first and the second overvoltage detector, thus ensures that the control bus is activated as soon as the potential at the first or the second supply voltage node leaves a permissible potential range in the event of an electrostatic discharge. This can occur as a result of a maximum possible limit value being exceeded or a minimum negative limit value being undershot. The overvoltage detectors can be designed appropriately for the associated supply voltages. This means that a first overvoltage detector which is associated with a low supply voltage of, for example, $V_{DD1}$=1.8 V in fact activates the control bus at a lower maximum permissible voltage between the first supply voltage node and ground than a second overvoltage detector which is associated with a high supply voltage of, for example, $V_{DD2}$=3.3 V.

The first and the second ESD protective elements may be connected in series. When an ESD load occurs, a discharge path can then be formed along both ESD protective elements.

In this case, the ESD protective circuit may have a third supply voltage node which is associated with a third supply voltage, that is to say the electronic circuit to be protected uses three supply voltages for operation. The ESD protective circuit is thus designed such that the output of the first ESD protective element is electrically connected to the second supply voltage node, and the output of the second ESD protective element is electrically connected to the third supply voltage node. In this case, the ESD protective circuit furthermore may have a third overvoltage detector with at least one measurement input for measurement of the potential at the third supply voltage node, and a control output for driving the control bus as a function of the measured potential.

This permits effective ESD protection between all three supply voltage nodes with the aid of two ESD protective elements without all three of the supply voltage nodes each having to be protected with respect to one another by means of three ESD protective elements. This particularly simplifies the bus routing. If the first and the second supply voltage network as well as the second and the third supply voltage network are, by way of example, adjacent in the pad frame area, a direct very long bus between the first and the third supply voltage network can be avoided. When an ESD load occurs between the first and the third supply voltage node, a positive or negative dissipation current flows from the first supply voltage node via the first ESD protective element and the supply buses to the second supply voltage node. The dissipation path continues via the second ESD protective element and the supply buses to the third supply voltage node.

It is possible to design the three overvoltage detectors such that they each measure the voltage between the supply voltage nodes associated with them and an internal ground node. In this case, one or more different internal ground nodes may be provided, which relate to different supply voltages. Alternatively, it is also possible to provide for one of the overvoltage detectors to measure the voltage between the first supply voltage node and the second or the third supply voltage node. Thus, in the second case, the difference voltage between the first supply voltage node and the second or the third supply voltage node is monitored directly. Direct monitoring of the voltage difference is particularly advantageous when the internal ground node is not connected to an external ground, that is to say when its potential is undefined.

As an alternative to the circuitry described above, the output of the first ESD protective element can also be electrically connected to an internal ground node, with the output of the second ESD protective element being electrically connected to the same internal ground node. In this case, when an ESD load occurs between the first and the second supply voltage node, a dissipation path is formed from the first supply voltage node, via the first ESD protective element, to the internal ground node, and continues via the second ESD protective element to the second supply voltage node.

Furthermore, in this case, a third ESD protective element can also be provided, and is electrically connected via one input to the first supply voltage node. This has a control input which is electrically connected to the control bus and via which it is activated in the event of ESD loads and, when in the activated state, dissipates charge received from the input via an output which is connected to the second supply voltage node. The use of a third ESD protective element results in a further dissipation path via the third ESD protective element in the event of an ESD load between the first and the second supply voltage node. The further dissipation path is in parallel with the dissipation path formed by the first and the second ESD protective element, thus reducing the resultant impedance of the entire discharge path created by the parallel circuit.

The overvoltage detector may have an additional reference input and be designed such that a signal which is suitable for activation of each ESD protective element is produced at the control output as soon as a first positive threshold voltage is exceeded between the measurement input and the reference input, which is typically connected to the internal ground node. Alternatively or additionally, a signal which is suitable for activation of each ESD protective element can be produced at the control output as soon as a second negative threshold voltage between the measurement input and the reference input is undershot. The threshold voltage may thus, in particular, be a diode breakdown voltage. An overvoltage detector such as this has a voltage divider between the measurement input and the reference input. The voltage divider is formed from a diode, in particular a zener diode, whose cathode side is electrically connected to the measurement input, and a resistor connected on the anode side of the diode. The potential at the voltage divider output is supplied to the control output.

In such an overvoltage detector, no supply voltage is used for the basic operation of the overvoltage detector—that is to say it is a passive circuit. This permits the ESD protection to be ensured not only during operation of the circuit but, in particular, during the processing steps which follow the actual manufacture of the circuit on the wafer, for example during packaging, during installation on a printed circuit board and during transportation. The use of a diode also in principle at the same time guarantees checking of both positive overvoltages and negative overvoltages. If the diode is operated in the reverse direction, that is to say the cathode potential is higher than the anode potential, the diode conducts as soon as a breakdown voltage which is typical of the respective diode is exceeded. If the diode is operated in the forward direction, that is to say the cathode potential is lower than the anode potential, it conducts as soon as a forward voltage which is typical of the respective diode is exceeded. When the diode is conducting, the resultant current flow can be converted via the series-connected resistor to a corresponding voltage signal in order to drive the control output.

The overvoltage detector has a pair of diodes connected back-to-back in parallel in the circuit element between the reference input and the control output. This is advantageous when the reference inputs of different overvoltage detectors are not connected to a common reference node, typically a common internal ground node. This is the case particularly when different internal ground nodes, which are not electrically connected to one another, are used in the electronic circuit. In a situation such as this, this measure prevents the various internal ground nodes from being coupled to one another via the control bus during operation of the electronic circuit. Coupling is thus avoided when there are differences in the voltage magnitudes between different internal ground nodes which do not exceed twice the diode forward voltage.

The first supply voltage node may be adjacent to the second supply voltage node in the layout. In addition, the second supply voltage node may then be adjacent to the third supply voltage node. In this situation, as already described above, long direct buses between the first and the third supply voltage network may be avoided. A dissipation path between the first and the third supply voltage node uses the buses and the ESD protective elements which are connected to the second supply voltage node.

In the case of an ESD protective method for an electronic circuit which uses at least one first and one second supply voltage, the potential at the first supply voltage node is measured. A first ESD protective element and a second ESD protective element are activated at the same time as a function of the measured potential at the first supply voltage node. In this case, the first and the second ESD protective element are designed and connected in a corresponding manner to the first and the second ESD protective element, respectively, as described above. The potential at the second supply voltage node is preferably also measured. In this case, the first ESD protective element and the second ESD protective element are activated as a function of the potentials measured at the first and at the second supply voltage node.

The foregoing summary has been provided only by way of introduction. Nothing in this section should be taken as a limitation on the following claims, which define the scope of the invention.

DETAILED DESCRIPTION OF THE EMBODIMENTS

Figure 1:
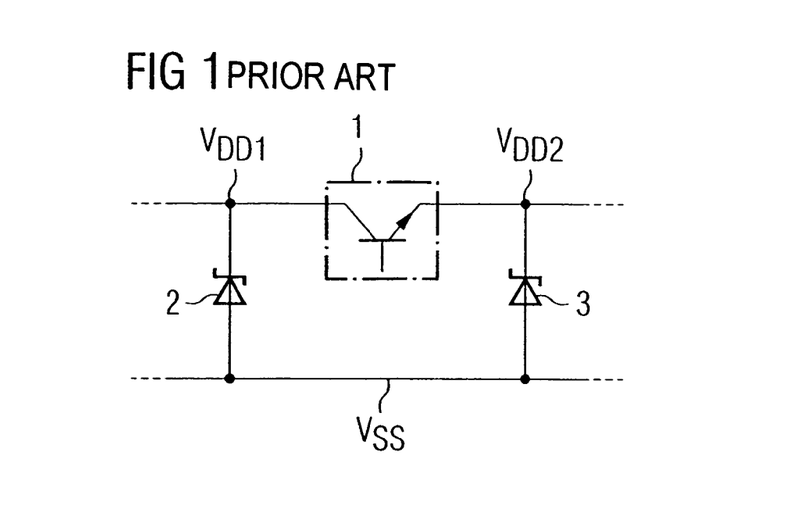
FIG. 1 shows standard ESD protection between two supply voltage networks according to the prior art.

FIG. 1 shows standard ESD protection between two supply voltage networks $V_{DD1}$ and $V_{DD2}$ for an integrated circuit, according to the prior art. In this case, one ESD protective element 1 is arranged between these networks. The ESD protective element 1 forms a charge dissipation path between the networks $V_{DD1}$ and $V_{DD2}$ when an ESD load occurs. This ESD protective element 1 is in the form of an npn transistor element, whose base is not connected, that is to say it is open. Standard ESD protection such as this furthermore has two zener diodes 2 and 3 between the supply voltage node $V_{DD1}$ and the internal ground node $V_{SS}$, and between the supply voltage node $V_{DD2}$ and the internal ground node $V_{SS}$. The zener diodes and the ESD protective element are reverse-biased during operation of the circuit to be protected.

If the node $V_{DD1}$ is charged as a result of an electrostatic discharge, a large-magnitude positive or negative voltage is produced between $V_{DD1}$ and $V_{DD2}$ and/or between $V_{DD1}$ and $V_{SS}$. If the voltage difference $V_{DD1}-V_{SS}$ exceeds the breakdown voltage $V_{BD,z}$ of the zener diode 2, this diode starts to conduct, so that a discharge path is formed between $V_{DD1}$ via the node $V_{SS}$. If the voltage difference $V_{DD1}-V_{DD2}$ exceeds a threshold voltage $V_{trigger}$, the ESD protective element 1 starts to conduct, so that a discharge path is formed between $V_{DD1}$ via the node $V_{DD2}$. The discharge path is formed depending on whether the nodes $V_{DD2}$ or $V_{SS}$ are electrically connected to the external environment of the integrated circuit; this is because the discharge path to the external environment can be formed only when a corresponding connection exists. A connection such as this may also exist in indirect form via one or more further chip-internal nodes.

Figure 7:
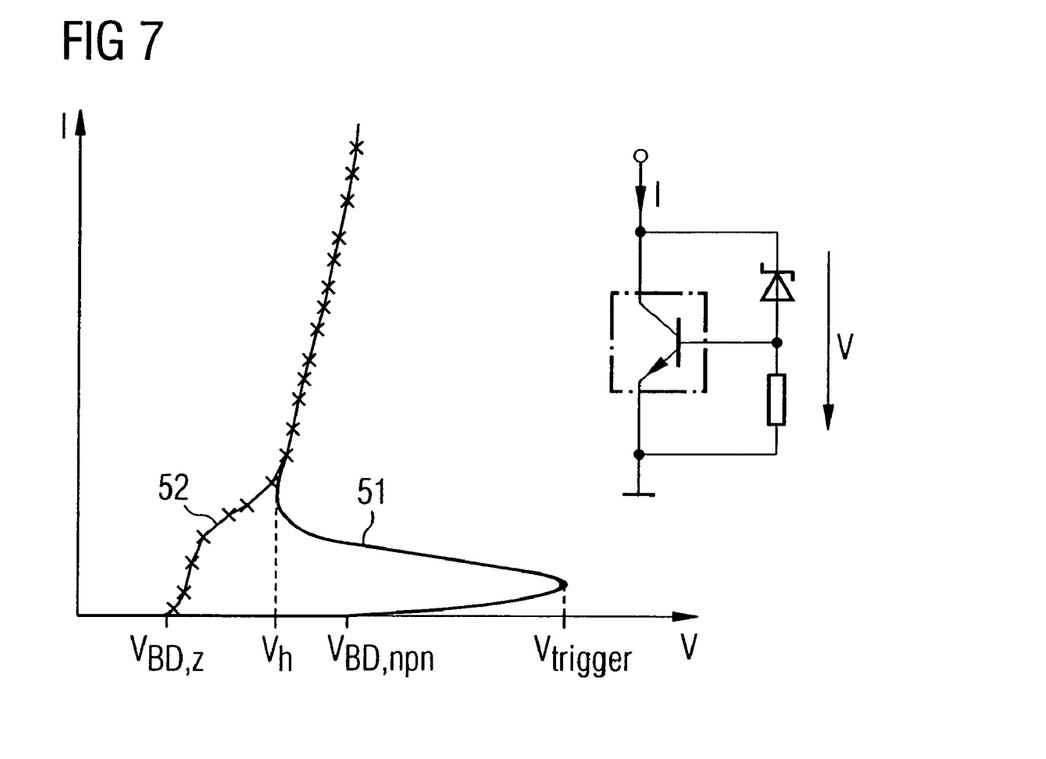
FIG. 7 shows an illustration of the current/voltage profile of two different ESD protective elements.

Reference should be made to the profile 51 of the voltage/current characteristic of an npn transistor element with an open base, as shown in FIG. 7, with regard to the method of operation of the ESD protective element 1. If the difference voltage between the collector and the emitter of the transistor element exceeds the breakdown voltage $V_{BD,npn}$, the collector current I through the npn transistor element slowly increases. When the difference voltage reaches a value $V_{trigger}$, the difference voltage collapses to a holding voltage $V_h$, with the differential and the absolute conductivity increasing greatly, so that the npn transistor element starts to conduct. Since an npn transistor element which is used as an ESD protective element is configured symmetrically, the voltage/current characteristic is symmetrical about a point with respect to the origin.

If the buses which connect the nodes $V_{DD1}$ or $V_{DD2}$ to the ESD protective element do not have a sufficiently low impedance, an increased voltage drop occurs across such metal buses in the event of an electrostatic discharge. If this voltage is higher than the breakdown voltage between two n-doped trenches in the circuit core, with the first trench being electrically connected to $V_{DD1}$ and the second trench being electrically connected to $V_{DD2}$, charge is dissipated between the n-doped trenches rather than via the ESD protective element 1, and this is generally associated with irreversible breakdown, thus making the circuit unusable.

The possibility of direct protection via the ESD protective element 1 between two supply voltage networks $V_{DD1}$ and $V_{DD2}$ as shown in FIG. 1 is generally provided only between adjacent supply voltage networks since, otherwise, the resistance of the buses is either too great or the bus area required excessively restricts the area which can be used for active circuit blocks. If no direct protection is provided between two supply networks which are not adjacent by means of an ESD protective element, a dissipation path can be formed only indirectly between these non-adjacent supply networks when an ESD load occurs, for example via the diodes 2 and 3.

In this case, there is a high risk of destructive charge equalization already having taken place via the circuit core before an indirect dissipation path such as this is formed.

Figure 2:
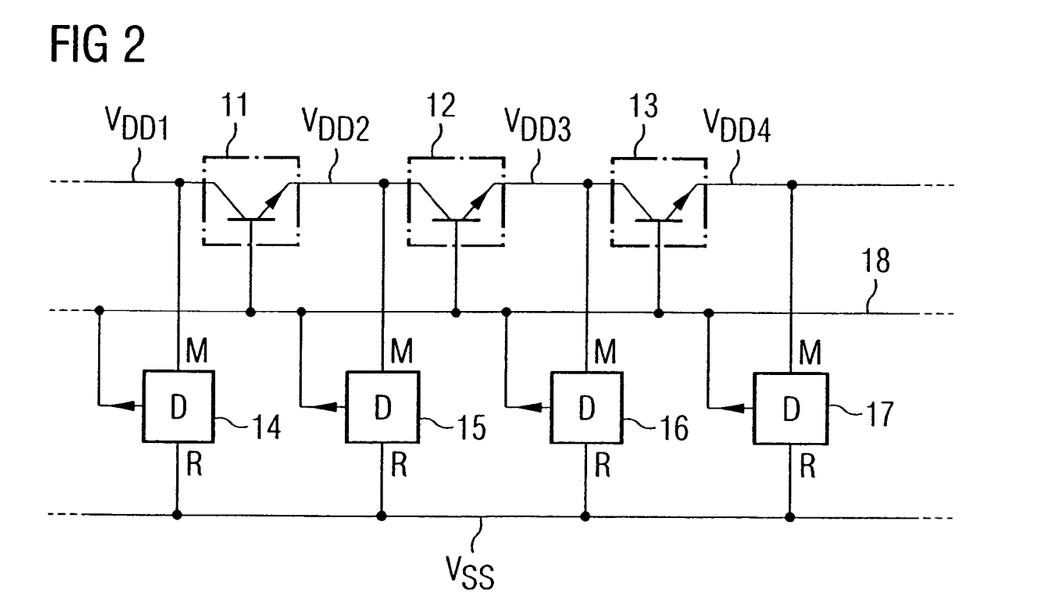
FIG. 2 shows a first exemplary embodiment of an ESD protective circuit according to the invention.

FIG. 2 shows a first exemplary embodiment of an ESD protective circuit according to the invention, which is used in its illustrated form for an integrated circuit which is to be protected and has at least four supply voltages. In this case, an ESD protective element 11, 12 or 13, respectively, is arranged between the first supply voltage node $V_{DD1}$ and the second supply voltage node $V_{DD2}$, between the second supply voltage node $V_{DD2}$ and the third supply voltage node $V_{DD3}$, as well as between the third supply voltage node $V_{DD3}$ and the fourth supply voltage node $V_{DD4}$. Two supply voltage nodes which are directly linked to one ESD protective element are arranged adjacent on the chip, in particular in the pad frame area. These ESD protective elements 11, 12 or 13 are in the form of npn transistor elements. Furthermore, the voltage between the supply voltage nodes $V_{DD1}$, $V_{DD2}$, $V_{DD3}$ and $V_{DD4}$ and the chip-internal ground potential $V_{SS}$ are monitored by overvoltage detectors 14, 15, 16 and 17, respectively, which respectively receive the potential from the corresponding supply voltage node and the potential from the internal ground node $V_{SS}$ via a measurement input (in each case marked by an M) and via a reference input (in each case marked by an R). Each of the overvoltage detectors 14, 15, 16 and 17 has a control output (in each case marked by an arrow), which is in each case electrically connected to a control bus 18. Furthermore, the bases of the npn transistor elements 11, 12 and 13 which are used as ESD protective elements are electrically connected to the control bus 18.

The ESD protective elements are designed such that they are not conductive during normal operation of the electronic circuit associated with the ESD protective circuit, that is to say they do not influence the externally applied potential. However, if a voltage between the respective supply voltage node and the ground node which exceeds a positive threshold value or undershoots a negative threshold value is detected in only one of the overvoltage detectors 14-17, the voltage state of the control bus is switched over by the respective overvoltage detector, so that all of the ESD protective elements 11-13 which are connected to the control bus 18 are switched to a conductive state at the same time, that is to say they are activated at the same time. This results in a protective low-impedance dissipation path.

If, by way of example, this is an electrostatic discharge, in which an electrostatic charge is applied to the supply voltage network $V_{DD1}$ from outside the chip and, furthermore, dissipation is possible via $V_{DD4}$ through an electrical connection between $V_{DD4}$ and the environment of the chip, a low-impedance discharge path is formed between $V_{DD1}$ and $V_{SS}$ by closing the protective elements when an overvoltage is detected. This discharge path passes from the node $V_{DD1}$ via the nodes $V_{DD2}$ and $V_{DD3}$ as well as the ESD protective elements 11-13 to the node $V_{DD4}$. Thus, in this situation, the ESD protective elements and the buses of the ESD protective elements between the adjacent supply voltage networks are also used for charge equalization between non-adjacent supply voltage networks, in this case $V_{DD1}$ and $V_{DD4}$.

The exemplary embodiment illustrated in FIG. 2 can be transferred in an analogous manner to an ESD protective circuit for an electronic circuit having any given number n, where n is greater than 2, of supply voltages, for example three or five supply voltages (indicated in FIG. 2 by dashed nodes $V_{DD1}$, $V_{DD4}$, 18, $V_{SS}$). It would also be feasible for the first supply voltage $V_{DD1}$ and the last supply voltage $V_{DD4}$ along the chain of supply voltage nodes illustrated in FIG. 2 to be coupled directly by means of an additional ESD element, which is not illustrated, provided that the networks $V_{DD1}$ and $V_{DD4}$ are adjacent in the layout.

Figure 3:
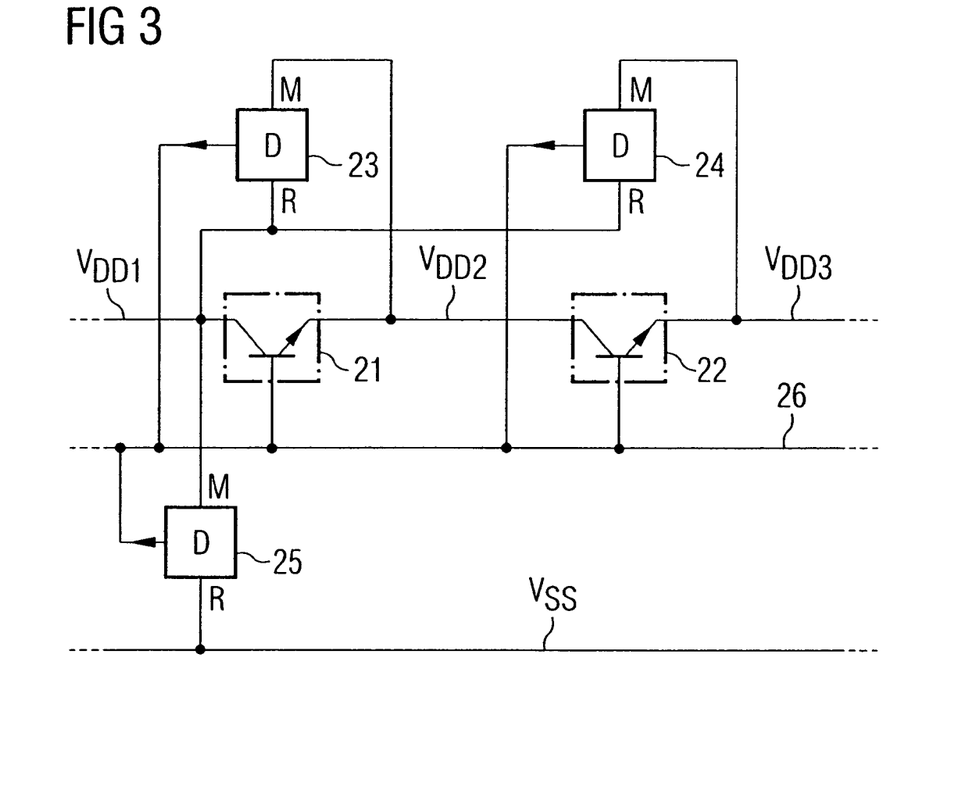
FIG. 3 shows a second exemplary embodiment of an ESD protective circuit according to the invention.

FIG. 3 shows a second exemplary embodiment of the ESD protective circuit according to the invention, which is used for an integrated circuit which is to be protected and has at least three supply voltages. In this case, a respective ESD protective element 21 or 22 is arranged between the first supply voltage node $V_{DD1}$ and the second supply voltage node $V_{DD2}$, and between the second supply voltage $V_{DD2}$ and the third supply voltage node $V_{DD3}$. The ESD protective elements 21 and 22 are in the form of npn transistor elements. Furthermore, the voltage between the supply voltage node $V_{DD1}$ and the chip-internal ground potential $V_{SS}$ is monitored by means of an overvoltage detector 25. In addition, the voltage differences between the supply voltage networks are also monitored directly. The voltage difference between the potential at the supply voltage node $V_{DD2}$ and the potential at the supply voltage node $V_{DD1}$ are monitored by means of an overvoltage detector 23. The voltage difference between the potential at the supply voltage node $V_{DD3}$ and the potential at the supply voltage node $V_{DD1}$ are monitored by means of an overvoltage detector 24 in a manner that is analogous to this. Each of the overvoltage detectors 23-25 has a control input (in each case marked by an arrow), which is in each case electrically connected to a control bus 26. Furthermore, the bases of the npn transistor elements 21 and 22 which are used as ESD protective elements are electrically connected to the control bus 26.

If one of the overvoltage detectors 23-25 detects a voltage between the respective measurement input and the reference input which exceeds a positive threshold value or undershoots a negative threshold value, the voltage state on the control bus is switched over by the respective overvoltage detector so that all of the ESD protective elements 21 and 22 which are connected to the control bus are switched to a conductive state at the same time.

Figure 4:
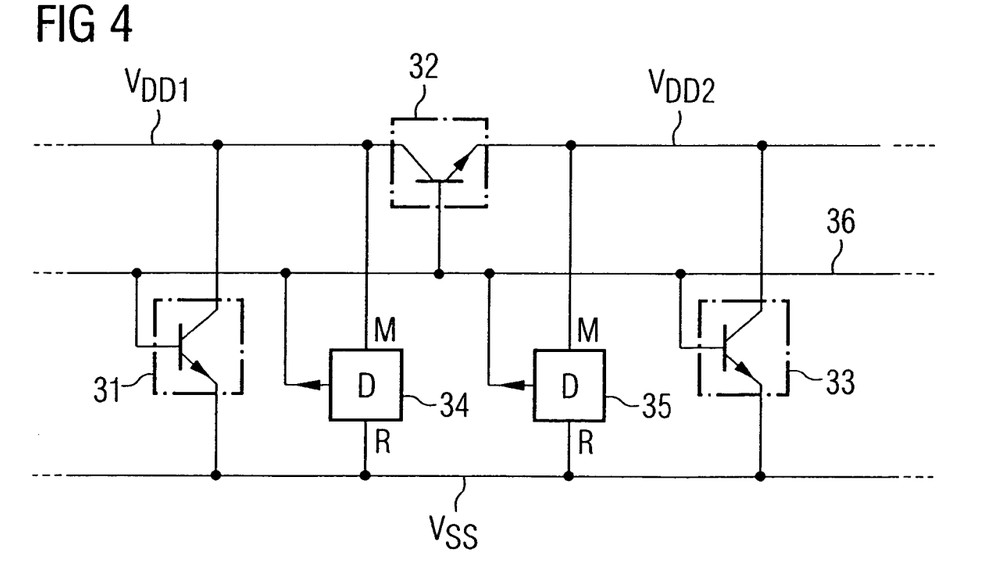
FIG. 4 shows a third exemplary embodiment of an ESD protective circuit according to the invention.

However, the circuit concept according to the invention is not restricted to ESD protective elements which are arranged between supply voltage networks. FIG. 4 shows the use of the circuit concept according to the invention for a third exemplary embodiment both for ESD protective elements which are placed directly between supply voltage networks and for ESD protective elements which are each arranged between a supply voltage network and the chip-internal ground node $V_{SS}$. As is shown in FIG. 2, an ESD protective element 32 is located between two supply voltage nodes $V_{DD1}$ and $V_{DD2}$. Furthermore, this ESD protective circuit according to the invention has two further ESD protective elements 31 and 33, which are connected between the nodes $V_{DD1}$ and $V_{SS}$ and between $V_{DD2}$ and $V_{SS}$, respectively. The protective elements 31 and 33 are thus connected to different supply voltage networks, which are not metallically connected to one another. Furthermore, the voltage between the supply voltage node $V_{DD1}$ and the chip-internal ground potential $V_{SS}$ as well as the voltage between the supply voltage nodes $V_{DD2}$ and the chip-internal ground potential $V_{SS}$ are respectively monitored by an overvoltage detector 34 or 35. Each of the overvoltage detectors 34 and 35 has a control input (in each case marked by an arrow) which is in each case electrically connected to a control bus 36. Furthermore, the bases of the npn transistor elements 31-33 which are used as ESD protective elements are electrically connected to the control bus 36.

If one of the overvoltage detectors 34 and 35 detects a voltage between the respective measurement input and the reference input which exceeds a positive threshold value or undershoots a negative threshold value, the voltage state of the control bus is switched over by the respective overvoltage detector such that all of the ESD protective elements 31 to 33 which are connected to the control bus are switched to a conductive state at the same time. In this case, both the ESD protective elements between two supply voltage nodes—in this case the ESD protective element 32—and the ESD protective elements between a supply voltage node and the chip-internal ground node $V_{SS}$—in this case the ESD protective elements 31 and 33—are activated.

Figure 5:
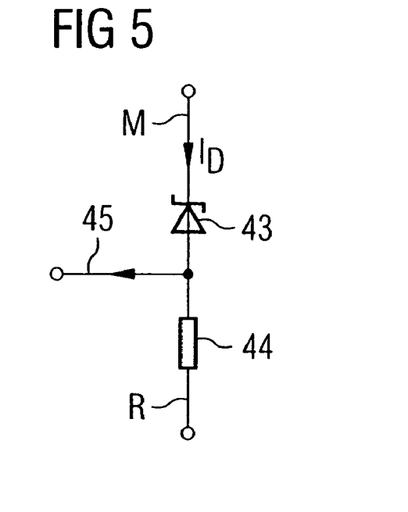
FIG. 5 shows a first exemplary embodiment of an overvoltage detector which is used in an ESD protective circuit according to the invention.

FIG. 5 shows a first exemplary embodiment of an overvoltage detector which is used in an ESD protective circuit according to the invention. The overvoltage detector has a voltage divider, which contains a zener diode 43 and a resistor 44, between a measurement input M and a reference input R.

In this case, the zener diode is oriented such that the anode is electrically connected to the measurement input. Furthermore, an output signal from the voltage divider is emitted via the control output 45.

If the positive voltage between the measurement input and the reference input during operation of the zener diode in the reverse-bias direction exceeds a breakdown voltage $V_{BD,z}$ which is typical for this embodiment of the zener diode, this zener diode starts to conduct, so that a current $I_D$ flows between the measurement input and the reference input. The current $I_D$ causes a voltage drop across the resistor 44. The potential at the control output 45 can be used to read whether an overvoltage has been detected between the measurement input and the reference input. Negative voltages whose magnitudes represent an overvoltage between the measurement input M and the reference input R could also be detected in an analogous manner. In this case, the diode conducts during operation in the forward direction, as soon as the voltage between the anode and the cathode exceeds the forward voltage of the diode. This is the situation when the voltage between the measurement input and the reference input is less than the negative level of the forward voltage.

In addition to the already explained voltage/current profile 51, FIG. 7 shows the resultant voltage/current profile 52 for an overvoltage detector as shown in FIG. 5 in conjunction with an npn transistor element which is driven by it, as sketched on the right-hand side of FIG. 7. In this case the X-axis describes the voltage V between the measurement input and the reference input of the overvoltage detector. The Y axis describes the current I, which is shown on the right-hand side as in FIG. 7, which flows into the resultant circuit formed by the overvoltage detector and the npn transistor element.

The profile 52 differs from the profile 51 in that the current I increases in a similar manner to the output value of characteristics of an npn bipolar transistor as soon as the voltage V has exceeded the breakdown voltage $V_{BD,z}$ of the zener diode. In this case, in general, the breakdown voltage $V_{BD,z}$ is less than the voltage values $V_{BD,npn}$ and $V_{trigger}$ of the npn transistor element with an open base. Beyond a voltage $V_h$, the differential and absolute conductivity increase sharply in a similar manner to that with the npn transistor element with an open base.

The overvoltage detector may also be designed to a different response in terms of the voltage value. This allows an overvoltage detector which is monitoring a supply voltage network $V_{DD1}$ with, for example, a nominal voltage of 3.3 V to respond only at higher voltages than an overvoltage detector which is monitoring a supply voltage network $V_{DD2}$ with a lower nominal voltage, for example 1.8 V. This can be achieved by using different zener diodes with different breakdown voltages $V_{BD,z}$. It is also possible to use a further diode in the path between the measurement input and the reference input, in particular between the measurement input M and the control input 45, to shift the response of the overvoltage detector towards higher voltages. When taking into account different nominal supply voltages, even minor ESD loads which differ from the smallest nominal supply voltage lead to an increase in the drive level of all the ESD protective elements which are connected to the control bus, thus resulting overall in voltage limiting at a low level.

Figure 6:
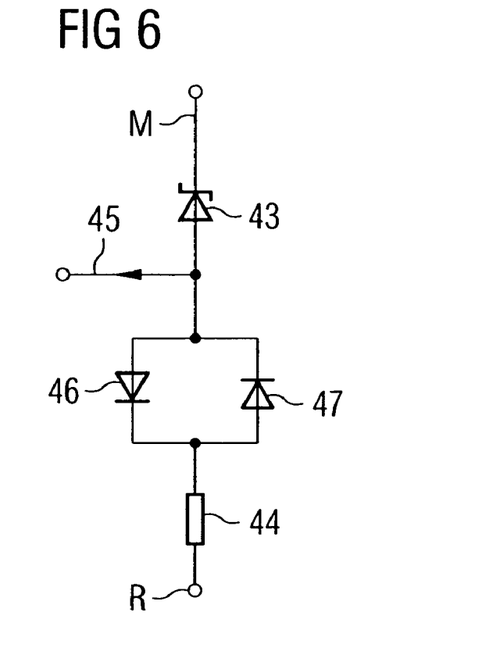
FIG. 6 shows a second exemplary embodiment of an overvoltage detector which is used in an ESD protective circuit according to the invention.

FIG. 6 shows a second exemplary embodiment of an overvoltage detector which is used in an ESD protective circuit according to the invention. In this case, elements and nodes from FIG. 5 and FIG. 6 which are provided with the same reference symbols correspond to one another. In addition, a pair of diodes 46 and 47 which are connected back-to-back in parallel are arranged in the path between the control output and the reference input. It is irrelevant to the operation of the pair of diodes whether the pair of diodes which are connected back-to-back in parallel—as illustrated in FIG. 6—or the resistor 44 is connected to the reference input.

The addition of the overvoltage detector to a pair of diodes connected back-to-back in parallel avoids the different ground nodes being coupled to one another via the control bus during operation of the electronic circuit when using two or more internal ground nodes (for example $V_{SS1}$ and $V_{SS2}$) and two or more overvoltage detectors which are connected to different internal ground nodes via the reference inputs. When using overvoltage detectors as shown in FIG. 6, an electrically conductive connection is produced via the control bus between two different reference nodes R of two overvoltage detectors only when the potentials at the reference nodes differ by at least twice the diode forward voltage.

Figure 8:
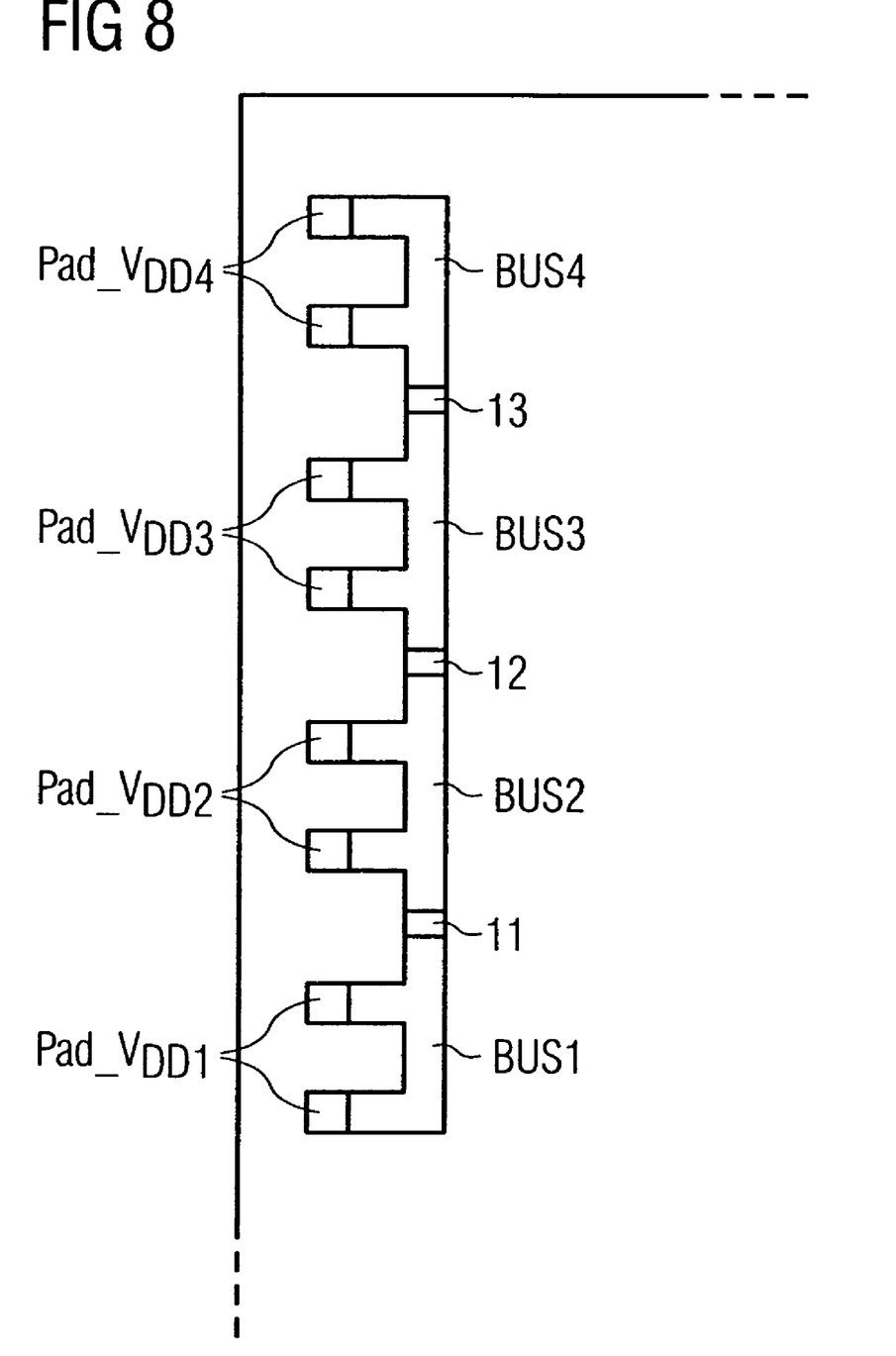
FIG. 8 shows a layout example of the first exemplary embodiment shown in FIG. 2.

FIG. 8 shows an example of the arrangement of the ESD protective elements 11-13 as shown in FIG. 3 in the pad-frame area of the integrated circuit. Four operating voltages $V_{DD1}$-$V_{DD4}$ are supplied via the pads Pad_$V_{DD1}$—Pad_$V_{DD4}$. The ESD protective elements 11-13 are arranged between two adjacent supply networks. The inputs and outputs of the ESD protective elements are connected to the supply voltage nodes via broad metal buses BUS1-BUS4. If an ESD load occurs between the nodes $V_{DD1}$ and $V_{DD2}$, the ESD protective elements 11-13 are activated, and a low-impedance conductive ESD protective path is formed via the buses BUS1-BUS4 and the intermediate ESD protective elements 11-13.

It is therefore intended that the foregoing detailed description be regarded as illustrative rather than limiting, and that it be understood that it is the following claims, including all equivalents, that are intended to define the spirit and scope of this invention. Other variations may be readily substituted and combined to achieve particular design goals or accommodate particular materials or manufacturing processes.

I claim:

1. An electrostatic discharge (ESD) protective circuit for an electronic circuit which uses at least one first and one second supply voltage, the ESD protective circuit comprising:
    a first ESD protective element comprising:
        an input that is electrically connected to a first supply voltage node associated with the first supply voltage, where the first supply voltage is supplied to the first supply voltage node via a first pad of the electronic circuit;
        a control input via which the first ESD protective element is activated in the event of ESD loads; and
        an output via which the first ESD protective element dissipates charge received from the input in an activated state;
    a second ESD protective element comprising:
        an input that is electrically connected to a second supply voltage node which is associated with the second supply voltage, where the second supply voltage is supplied to the second supply voltage node via a second pad of the electronic circuit;
        a control input via which the second ESD protective element is activated in the event of ESD loads; and
        an output via which the second ESD protective element dissipates charge received from the input in an activated state;
    a control bus which electrically connects the control inputs of the first and second ESD protective elements; and
    a first overvoltage detector comprising a measurement input for measurement of a first potential at the first supply voltage node and a control output for driving the control bus as a function of the measured first potential.

2. The ESD protective circuit according to claim 1, further comprising a second overvoltage detector comprising a measurement input for measurement of a second potential at the second supply voltage node and a control output for driving the control bus as a function of the measured second potential.

3. The ESD protective circuit according to claim 2, wherein the first and the second ESD protective elements are connected in series.

4. The ESD protective circuit according to claim 3, wherein the ESD protective circuit comprises a third supply voltage node which is associated with a third supply voltage, the third supply voltage being supplied to the third supply voltage node via a third pad of the electronic circuit, the output of the first ESD protective element is electrically connected to the second supply voltage node, and the output of the second ESD protective element is electrically connected to the third supply voltage node.

5. The ESD protective circuit according to claim 4, further comprising a third overvoltage detector comprising a measurement input for measurement of a third potential at the third supply voltage node and a control output for driving the control bus as a function of the measured third potential.

6. The ESD protective circuit according to claim 5, wherein the first, second and third overvoltage detectors are operable to measure the voltage between a supply voltage node associated with the first, second and third overvoltage detectors, respectively, and an internal ground node.

7. The ESD protective circuit according to claim 5, wherein one of the first, second, and third overvoltage detectors measures the voltage between the first supply voltage node and the second or the third supply voltage node.

8. The ESD protective circuit according to claim 1, wherein the output of the first ESD protective element is electrically connected to an internal ground node and the output of the second ESD protective element is electrically connected to the internal ground node.

9. The ESD protective circuit according to claim 8, further comprising a third ESD protective element which is electrically connected via an input to the first supply voltage node, comprises a control input which is electrically connected to the control bus and via which the third ESD protective element is activated in the event of ESD loads, and dissipates charge received from the input in the activated state via an output of the third ESD protective element that is connected to the second supply voltage node.

10. The ESD protective circuit according to claim 1, wherein the first overvoltage detector comprises a reference input and is operable to produce a signal at the control output that activates each ESD protective element, as soon as at least one of: a positive threshold voltage is exceeded between the measurement input and the reference input, and a negative threshold voltage between the measurement input and the reference input is undershot.

11. The ESD protective circuit according to claim 10, wherein the overvoltage detector comprises a voltage divider between the measurement input and the reference input, the voltage divider comprises a diode and a resistor, the diode comprises a cathode connected to the measurement input, and the resistor is connected to an anode of the diode, and an output from the voltage divider is supplied to the control output.

12. The ESD protective circuit according to claim 11, wherein the overvoltage detector comprises a pair of diodes connected back to back in parallel between the reference input and the control output.

13. The ESD protective circuit according to claim 1, wherein at least one of the first and second ESD protective elements comprises a bipolar transistor element.

14. The ESD protective circuit according to claim 4, wherein the first supply voltage node is adjacent to the second supply voltage node and the second supply voltage node is adjacent to the third supply voltage node.

15. An ESD protective method for an electronic circuit which uses first and second supply voltages, the method comprising:
supplying the first supply voltage to a first supply voltage node via a first pad of the electronic circuit;
supplying the second supply voltage to a second supply voltage node via a second pad of the electronic circuit;
measuring a potential at the first supply voltage node; and
activating first and second ESD protective elements at the same time as a function of the measured potential at the first supply voltage node, wherein the first ESD protective element is electrically connected via an input to the first supply voltage node, comprises a control input via which the first ESD protective element is activated in the event of ESD loads, and dissipates charge received from the input in an activated state via an output of the first ESD protective element, and the second ESD protective element is electrically connected via an input to the second supply voltage node, comprises a control input via which the second ESD protective element is activated in the event of ESD loads, and dissipates charge received from the input in an activated state via an output of the second ESD protective element.

16. An electrostatic discharge (ESD) protective circuit for an electronic circuit that uses a first and a second supply voltage, the ESD protective circuit comprising:
a first ESD protective element which is electrically connected via a first input to a first supply voltage node associated with the first supply voltage, comprises a first control input via which the first ESD protective element is activated in the event of ESD loads, and dissipates charge received from the first input in an activated state via an output of the first ESD protective element;
a second ESD protective element which is electrically connected via a second input to the second supply voltage node which is associated with the second supply voltage, comprises a second control input via which the second ESD protective element is activated in the event of ESD loads, and dissipates charge received from the second input in an activated state via an output of the second ESD protective element, where the outputs of the first and second ESD protective elements are electrically connected to an internal ground node;
a third ESD protective element that is electrically connected via an third input to the first supply voltage node, comprises a third control input via which the third ESD protective element is activated in the event of ESD loads, and dissipates charge received from the third input in the activated state via an output of the third ESD protective element that is connected to the second supply voltage node;
a control bus which electrically connects the first, second, and third control inputs; and
a first overvoltage detector comprising a measurement input for measurement of a first potential at the first supply voltage node and a control output for driving the control bus as a function of the measured first potential.

17. The electrostatic discharge (ESD) protective circuit of claim 16, further comprising:
a second overvoltage detector configured to monitor the voltage difference between the first potential and a second potential at the second supply voltage node, the second overvoltage detector comprising:
a measurement input for measurement of the second potential at the second supply voltage node;
a reference input for measurement of the first potential at the first supply voltage node; and
a control output for driving the control bus based on the voltage difference between the first potential and the second potential.

18. The ESD protective circuit according to claim 2, the second overvoltage detector further comprising a reference input for measurement of the first potential at the first supply voltage node, and where the control output drives the control bus as a function of the voltage difference between the first potential and the second potential.

19. The ESD protective circuit according to claim 5, the third overvoltage detector further comprising a reference input for measurement of the first potential at the first supply voltage node, and where the control output drives the control bus as a function of the voltage difference between the first potential and the third potential.

* * * * *